United States Patent [19]
McCullough et al.

[11] Patent Number: 5,453,720
[45] Date of Patent: Sep. 26, 1995

[54] DIGITAL ADJUSTABLE PHASE MODULATOR AND METHOD

[75] Inventors: Pineabrim McCullough, Jr., Tempe; Hugh R. Malone, Phoenix, both of Ariz.

[73] Assignee: Motorola, Inc., Schaumburg, Ill.

[21] Appl. No.: 276,364

[22] Filed: Jul. 18, 1994

[51] Int. Cl.⁶ .............................. H03C 3/22; H04L 27/20
[52] U.S. Cl. ................. 332/103; 332/105; 332/146; 375/282; 375/308; 455/42; 455/111
[58] Field of Search ........................... 332/103, 104, 332/105, 144, 146; 375/52, 55, 67; 455/42, 110, 111

[56] References Cited

U.S. PATENT DOCUMENTS

| | | | |
|---|---|---|---|
| 3,349,342 | 10/1967 | Garver | 332/105 |
| 4,994,773 | 2/1991 | Chen et al. | 333/164 |
| 5,081,432 | 1/1992 | Devlin et al. | 332/103 |
| 5,148,128 | 9/1992 | Mazumder | 332/103 |

*Primary Examiner*—Siegfried H. Grimm
*Attorney, Agent, or Firm*—Jeffrey D. Nehr

[57] ABSTRACT

A digital adjustable phase modulator and method includes a first circuit path and a second circuit path for a signal. A fixed bias voltage is coupled to the first circuit path and to the second circuit path which respectively include first and second active variable reactance components such as varactor diodes. The first circuit path and the second circuit path further include chip capacitors to provide a DC block for first and second MMIC single pole double throw switches, and transmission lines for the signal have a length of one-fourth of a wavelength of the signal to provide an RF short. A control voltage is coupled to the first and second varactor diodes such that the capacitances across the first and second varactor diodes changes, resulting in a phase difference between the signal traversing the first circuit path relative to the signal traversing the second circuit path.

20 Claims, 3 Drawing Sheets

DIGITAL ADJUSTABLE PHASE MODULATOR AND METHOD

FIELD OF THE INVENTION

This invention relates in general to the field of biphase modulators, more specifically to biphase modulators having adjustable phase shifts, and more particularly to biphase modulators having close amplitude balance between two output modulation states.

BACKGROUND OF THE INVENTION

Biphase modulation is important for many electronic products which require digital coding of radio frequency signals, such as PN coded signals. Biphase modulation is often required in products constrained with small size, low power draw and robust operation in a broad variety of environments. Examples of such applications include munitions fuzes, radar apparatus and communications systems.

Conventional biphase modulators suffer from lack of flexibility in choosing modulation angles and are typically restricted to 0 degrees and 180 degrees modulation angles. Multiphase modulation schema (e.g. QAM) typically provide phase angles of integer submultiples of 180 degrees (e.g., 45 degrees, 90 degrees, etc.). It is especially uneconomical and impractical to provide close amplitude balance over significant bandwidth between signal portions having different modulation angles, particularly when modulation angles other than submultiples of 180 degrees are required.

Phase shifters can be either analog or digital. An analog phase shifter typically features varactor diodes whose capacitance changes as a function of bias voltage. The change in capacitance causes a change in the transmission phase of the network. The major limitation with analog phase shifters is that it is difficult to accurately switch between to voltages at high speeds (i.e. >10 MHz).

Digital phase shifters are designed using switching elements such as PIN diodes or FETs. Many configurations of digital phase shifters have been demonstrated, including quadrature couplers with two ports terminated (using either FETs or PIN diodes used to provide two different angles of reflection coefficients) and PIN diode or FET switches used to select one of two different line lengths. While digital phase shifters can operate at very high speeds (<10 nanoseconds), they do not provide any variation in phase shift.

What is needed is a practical, economical apparatus and accompanying method for providing biphase modulation of signals with adjustable phase angles, particularly combined with close amplitude tracking between the two phase states of the modulator. Such a biphase modulator apparatus and method should be realizable in compact form, having low power dissipation and providing robust performance over a broad range of operating conditions. Preferably, the method and apparatus would provide a means to obtain digital phase shifting with the value of phase shift adjustable by means of a control voltage. Such a device would provide the speed and accuracy of a digital phase shifter with the adjustability of an analog phase shifter, providing any desired phase shift and range of adjustment.

DETAILED DESCRIPTION OF THE DRAWINGS

Generally, the preferred embodiment of the present invention described below provides a digital adjustable phase modulator 90, with the value of phase shift adjustable by means of a control voltage 12. The apparatus and method provide the speed and accuracy of a digital phase shifter with the adjustability of an analog phase shifter. While the method discussed is particularly suited for the particular applications described below, other applications for the digital adjustable phase modulator method will be readily apparent to those of skill in the art.

Figure 1:
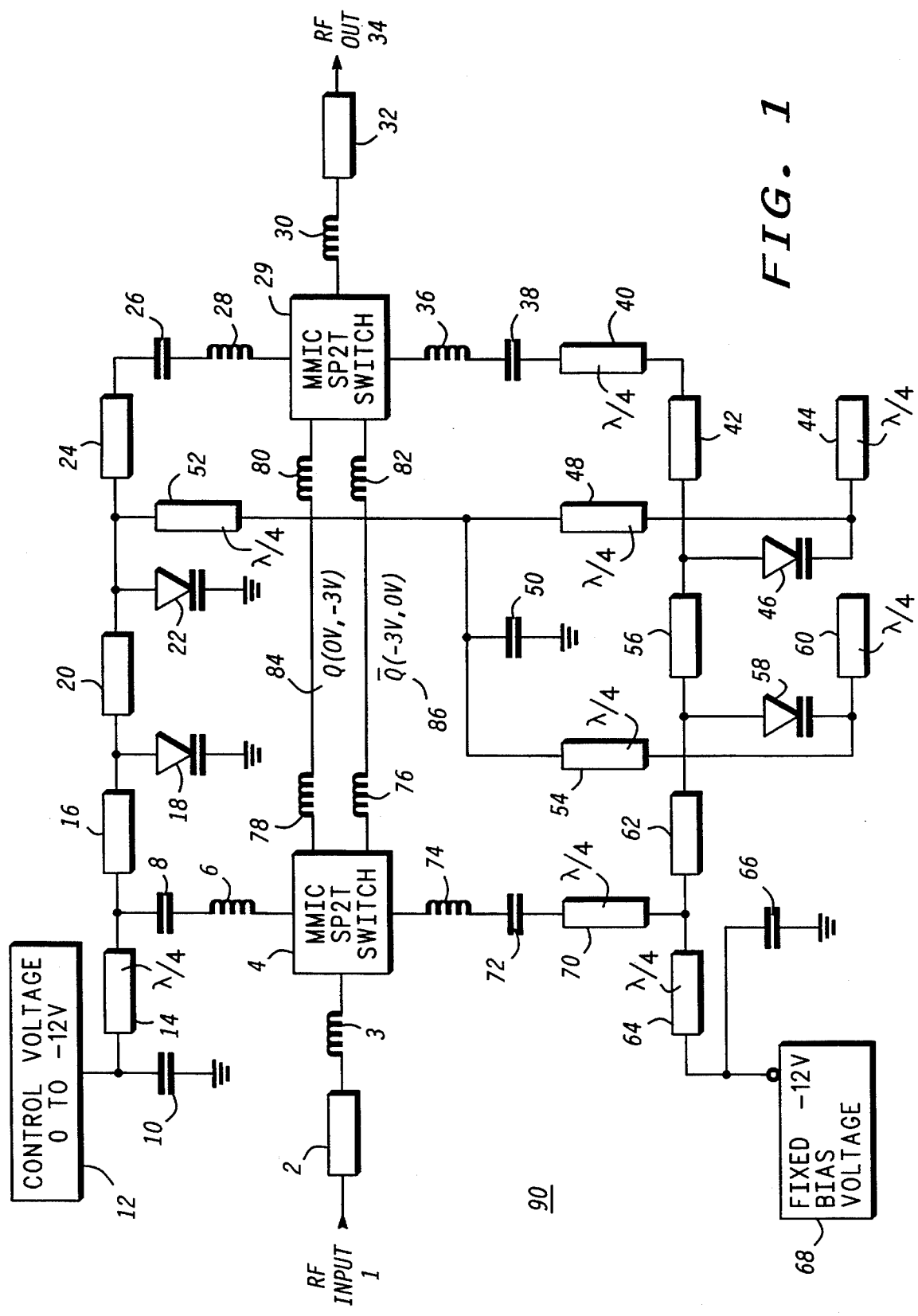
In FIG. 1, there is shown a digital adjustable phase modulator and method in accordance with a preferred embodiment of the invention.

FIG. 1 is a simplified schematic diagram of an embodiment of a digital adjustable phase modulator 90 in accordance with the present invention. The digital adjustable phase modulator 90 features two monolithic microwave integrated circuit (MMIC) single pole double throw (SP2T) switches 4 and 29 and four chip varactor diodes 18, 22, 46, and 58.

The MMIC SP2T switches 4 and 29 are implemented in the preferred embodiment using series-shunt-shunt topology to achieve low insertion loss and high isolation. The SP2T switches 4 and 29 provide a means to switch in varactor diodes 18 and 22 as well as varactor diodes 58 and 46 between RF input 1 and RF output 34. The SP2T switches 4 and 29 in the preferred embodiment were fabricated using a Triquint 0.5 µm process (Triquint Semiconductor, Beaverton, Oregon). The SP2T switches 4 and 29 are commercially available, off-the-shelf products.

The SP2T switches 4 and 29 are switched with Q (0 V, −3 V) 84 and "Q not" (−3 V, 0 V) 86. The Q 84 and Q not 86 are coupled to the MMIC SP2T switches 4 and 29 by wirebonds 76, 78, 80 and 82. The wirebonds 76, 78, 80 and 82 are represented in FIG. 1 as inductors.

The SP2T switches 4 and 29 are coupled within the digital biphase modulator 90 via wirebonds 3, 6, 28, 30, 36 and 74 (also shown as inductors). Transmission line 2 is coupled to MMIC SP2T switch 4 through wirebond 3, and transmission line 32 is coupled to MMIC SP2T switch 29 through wirebond 30.

Control voltage 12 (0 to −12 V in the preferred embodiment) is applied to a junction of capacitor 10 and transmission line 14. A second side of capacitor 10 is coupled to ground. Transmission lines 14, 16, 20, and 24 are connected in series, ending with transmission line 24 coupled through the series combination of capacitor 26 and wirebond 28 to MMIC SP2T switch 29. MMIC SP2T switch 4 is coupled to the common connection of transmission lines 14 and 16 through the series combination of capacitor 8 and wirebond 6. The common connection of transmission lines 16 and 20 is coupled through varactor diode 18 to electrical ground. The common connection of transmission lines 20 and 24 is coupled both through varactor diode 22 to electrical ground and through the series combination of transmission lines 52 and 48 to transmission line 44. The common connection between transmission lines 52 and 48 is coupled both through transmission line 54 to transmission line 60 and through capacitor 50 to electrical ground.

Fixed bias voltage 68 (−12 V in the preferred embodiment) is [coupled through] applied to a junction of capacitor 66 and transmission line 64. A second side of capacitor 66 is coupled to electrical ground. [and also through the series combination of transmission] Transmission lines 64, 62, 56, 42, and 40 [as well as] are connected in series ending with transmission line 40 coupled through the series combination of capacitor 38 and wirebond 36 to MMIC SP2T switch 29. The common connection of transmission lines 64 and 62 is coupled through the series combination of transmission line 70, capacitor 72, and wirebond 74 to MMIC SP2T switch 4. The common connection between transmission line 62 and transmission line 56 is coupled through varactor diode 58 to the common connection between transmission lines 54 and 60. The common connection between transmission lines 56 and 42 is coupled through varactor diode 46 to transmission line 44.

Parallel plate wire-bondable chip capacitors 8, 26, 38 and 72 (e.g., available from American Technical Ceramics, Huntington Sta., N.Y.) were utilized in the digital biphase modulator 90 for two purposes. One is to resonate out the wirebond inductance and the second is to provide a DC block for the MMIC SP2T switches 4 and 29. Transmission lines 14, 52, 54, 48, 40, 70, 64, 60, and 44 are quarter-wavelength transmission lines.

Transmission lines 40 and 70 add an additional 180 degrees to the path beginning with RF input 1 and through varactor diodes 58 and 46 to RF output 34 as compared to the path through RF input 1, varactor diodes 18 and 22, to RF output 34. Thus, the path beginning with RF input 1 through varactor diodes 18 and 22 to RF output 34 provides a phase difference of 180 degrees compared with the path through RF input 1, varactor diodes 58, 46, to RF output 34.

The varactor diodes 18, 22, 46 and 58 (e.g., from Alpha Industries Woburn, Massachusetts in the preferred embodiment) shown in FIG. 1 are used in a reverse bias state to induce capacitance in both transmission paths. The varactor diodes 18, 22, 46 and 58 selected for this invention were Alpha CVH2030-01 to provide a minimum of +/−15 degrees phase shift over the control voltage 12 range (0 to −12 volts). Other varactor diodes are available to achieve greater or lesser differential phase shift for the equivalent control voltage 12. Note also that other active variable reactance components can be used in place of varactor diodes 18, 22, 46, and 58, e.g. MOSFETs or other transistors.

The varactor diodes 18, 22, 46 and 58 are biased by a fixed bias voltage 68 at −12 volts and a control voltage 12. The high impedance quarter wavelength transmission lines 14, 64, 52, 54 and 48 and the capacitors 10, 50 and 66 are used as RF bypass elements. An RF open occurs at the frequency where the length of transmission lines 14, 64, 52, 54 and 48 are a quarter wavelength of the RF signal. Additionally, transmission lines 60 and 44 are provided as RF bypass elements. Transmission lines 60 and 44 provide an RF short at the frequency at which the length of transmission lines 60 and 40 are a quarter wavelength of the RF signal.

The bias scheme functions with the fixed bias voltage 68 equal to −12 volts and the control voltage 12 equal to −6 volts. Varactor diodes 18 and 22 have −6 volts applied to the anode via transmission lines 14 and 16. The control voltage 12 is also applied to the cathode of varactor diode 58 and 46 via transmission lines 16, 20, 52, 54 and 48. The fixed bias voltage 68 is also applied to the anode of diodes 58 and 46 via transmission line 64 and 62. Thus, both varactor diodes pairs 18, 22 and 58, 46 have −6 volts voltage drop across them.

The voltage drop across each varactor diode induces a capacitance. In the preferred embodiment, for example, with a −6 V control voltage 12, all four varactor diodes 18, 22, 46 and 58 induce equivalent capacitance in both paths beginning with RF input 1, through varactor diodes 18 and 22, and ending with RF output 34 as opposed to the path beginning with RF input 1, through varactor diodes 58 and 46 to RF output 34. The bias scheme allows for an increase in control voltage 12, decrease in the voltage drop across varactor diodes 58 and 46, while increasing the voltage drop across varactor diodes 18 and 22. When the control voltage 12 is changed, the amount of capacitance induced changes. For example, an increase in the induced capacitance makes the path insertion phase more negative.

Figure 2:
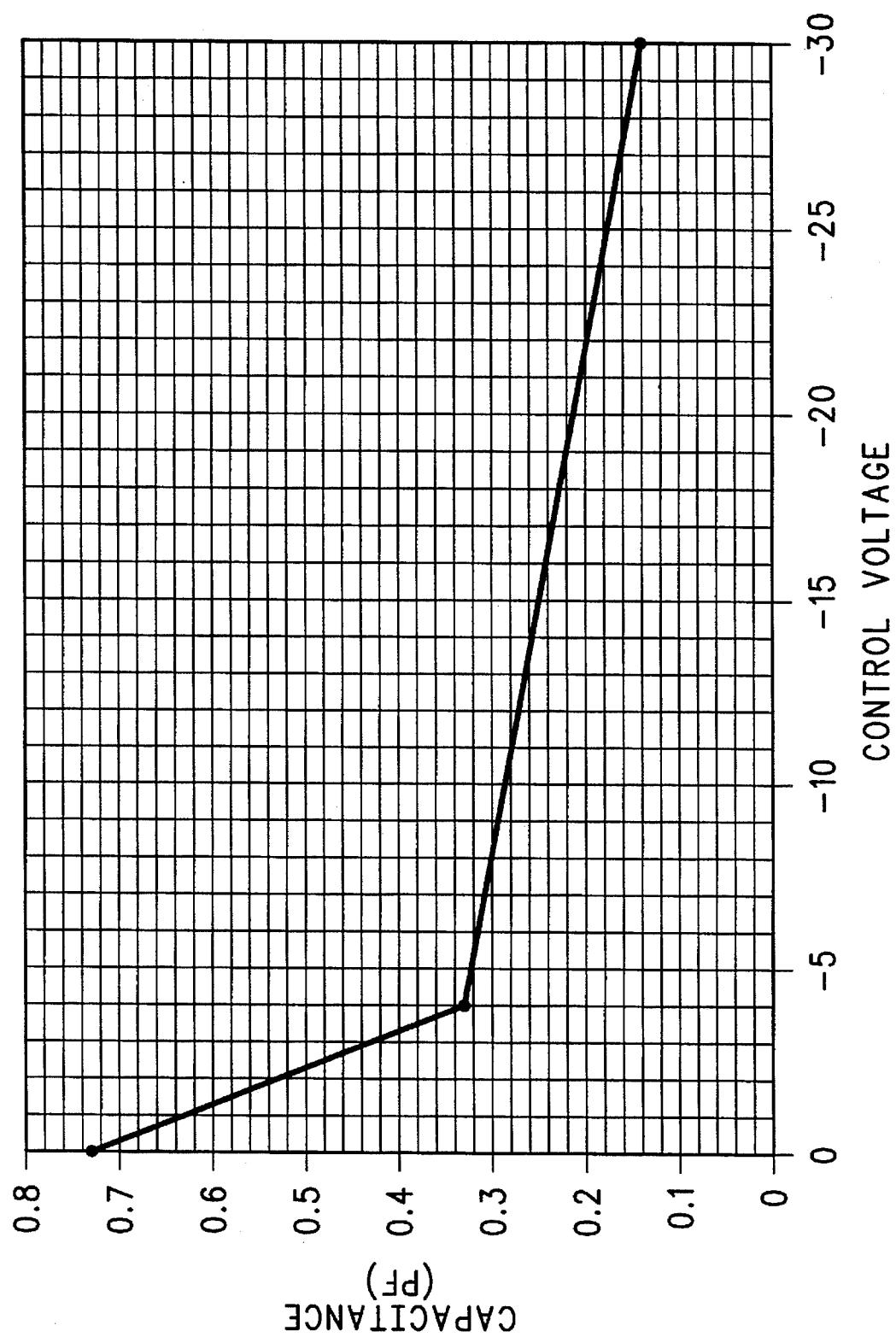
In FIG. 2, there is shown a graph of the variation of capacitance with control voltage for the varactor diodes in the FIG. 1 embodiment; and In FIG. 3, there is shown a graph of differential phase from 180 degrees as a function of control voltage for the digital adjustable phase modulator in FIG. 1.

FIG. 2 illustrates the variability of varactor diode capacitance as a function of control voltage 12. The varactor diodes each have a capacitance of 0.14 pF when the control voltage equal −30 volts and 0.75 pF capacitance at a control voltage 12 equal to 0 volts. FIG. 2 also shows the non-linear effects of capacitance versus bias voltage.

When the control voltage 12 equals −6 volts, the four varactor diodes 18, 22, have equivalent capacitance 0.32 pF (from FIG. 2). Thus, the digital adjustable phase modulator 90 has a differential phase of +180 degrees and differential amplitude imbalance less than 0.2 dB between the path through RF input 1, varactor diodes 18 and 22, and RF output 34 compared with the path through RF input 1, varactor diodes 58 and 46, and RF output 34.

When the control voltage 12 changes, for example to −3 volts, varactor diodes 18 and 22 exhibit 0.42 pF capacitance in the path RF input 1, varactor diodes 18 and 22, RF output 34 which decreases the path insertion phase. While varactor diodes 58 and 46 exhibit a capacitance of 0.28 pF into the path RF input 1, varactor diodes 58 and 46, RF output 34 which increases the path insertion phase. The change in both path phase results in a differential phase for the digital adjustable phase modulator 90 +12 degrees. Likewise, for a −9 volt control voltage 12, the capacitance for varactor diodes 18 and 22 is 0.28 pF and the capacitance for varactor diodes 46 and 58 is 0.42 pF and the change in capacitance changes the differential phase to −10 degrees.

Figure 3:
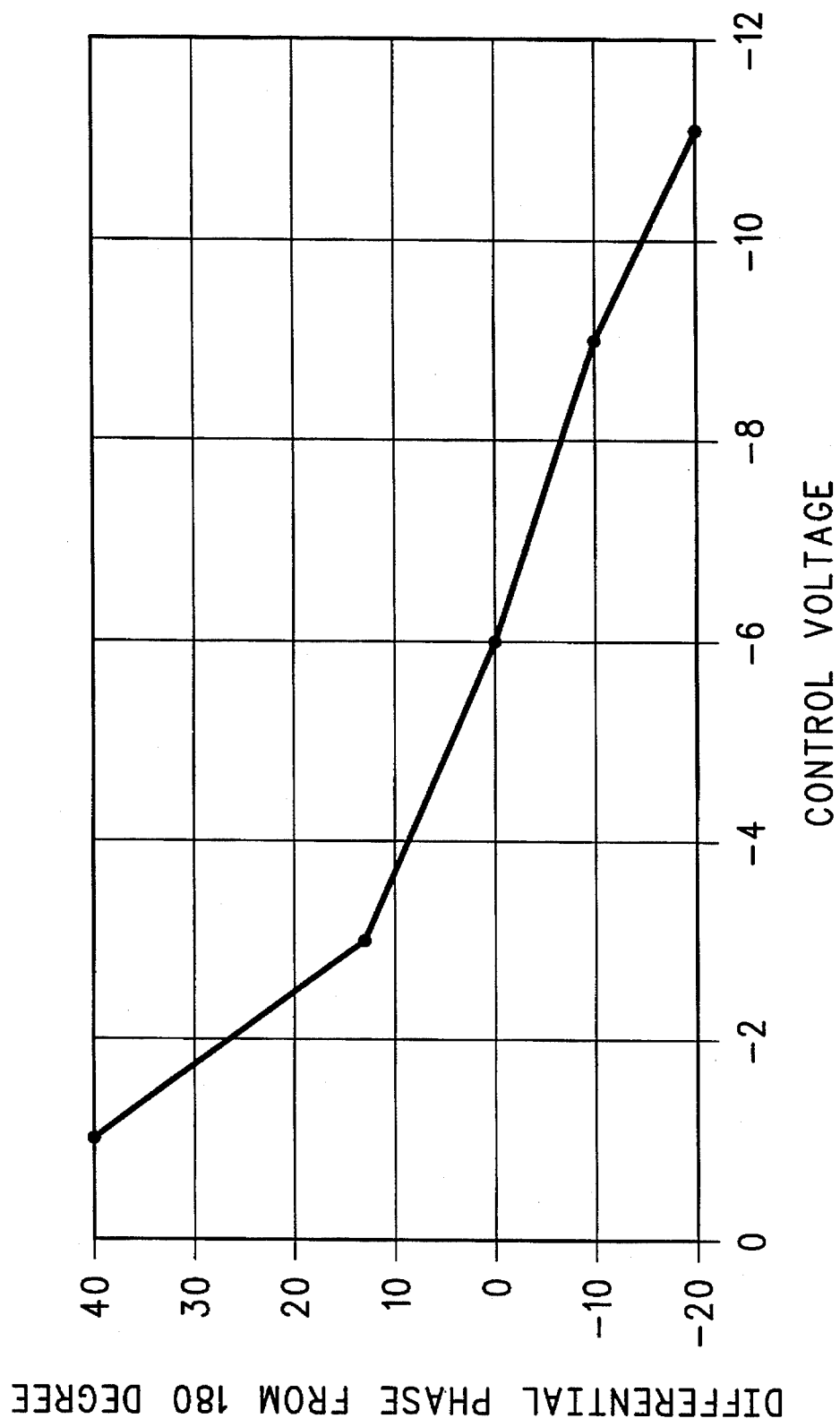

FIG. 3 shows the digital adjustable phase modulator 90 differential phase from 180 degrees as a function of control voltage 12. As the control voltage 12 deviates from −6 volts, the differential phase from 180 degrees increases. For example, the differential phase for −3 control voltage is −12 degrees.

Thus, a digital adjustable phase modulator and method has been described which overcomes specific problems and accomplishes certain advantages relative to prior art methods and mechanisms. The improvements over known technology are significant. The digital adjustable phase modulator 90 combines both a digital and an analog phase shifter in one circuit topology. The digital adjustable phase modulator 90 provides a tunable modulated signal with less than 0.2 dB amplitude imbalance. The preferred embodiment of the invention utilizes the varactor diodes in conjunction with transmission lines to realizes a tunable (165 degrees–195 degrees) differential phase shift. The diode bias arrangement provides the bias on one set of diodes to increase while that for a second set decreases, thus giving the greatest phase shift with the minimum change in bias voltage. The preferred embodiment exhibits less than 0.2 dB amplitude imbalance between the two output modulation states. The preferred embodiments provide a nominal phase shift of 180 degrees with an adjustment of +/−15 degrees from nominal.

Thus, there has been provided a digital adjustable phase modulator and method that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A digital adjustable phase modulator for phase modulating a signal, the phase modulator comprising:

a first circuit path and a second circuit path for the signal;

a bias voltage coupled to the first circuit path and to the second circuit path;

first and second active variable reactance components included within the first circuit path and the second circuit path, respectively; and a control voltage coupled to the first and second active variable reactance components such that a first capacitance across the first active variable reactance component and a second capacitance across the second active variable reactance component are changed resulting in a phase difference between the signal traversing the first circuit path relative to the signal traversing the second circuit path.

2. A phase modulator as claimed in claim 1, further comprising first and second microwave monolithic integrated circuit (MMIC) single pole double throw switches coupled to the first circuit path and to the second circuit path for routing the signal to the first circuit path and to the second circuit path.

3. A phase modulator as claimed in claim 2, further comprising transmission lines comprising the first circuit path and the circuit second path.

4. A phase modulator as claimed in claim 3, wherein the first circuit path and the second circuit path further comprise chip capacitors to provide a DC block for the first and second MMIC single pole double throw switches.

5. A phase modulator as claimed in claim 3, wherein the transmission lines comprise transmission lines having a length of one-fourth of a wavelength of the signal.

6. A phase modulator as claimed in claim 1, wherein the first and second active variable reactance components comprise first and second pairs of varactor diodes.

7. A phase modulator as claimed in claim 6, wherein the control voltage increases a first voltage across the first pair of varactor diodes while simultaneously decreasing a second voltage across the second pair of varactor diodes to produce the phase difference between the signal traversing the first circuit path relative to the signal traversing the second circuit path.

8. A method for phase modulating a signal, the method comprising the steps of:

providing a first path and a second path for the signal;

biasing first and second active variable reactance components with a bias voltage, wherein the first and second active variable reactance components are included within the first path and the second path, respectively; and applying a control voltage to the first and second active variable reactance components such that a first capacitance across the first active variable reactance component and a second capacitance across the second active variable reactance component are changed resulting in a phase difference between the signal traversing the first path relative to the signal traversing the second path.

9. A method as claimed in claim 8, wherein the step of providing a first path and a second path for the signal comprises the step of providing first and second microwave monolithic integrated circuit (MMIC) single pole double throw switches for routing the signal to the first path and to the second path.

10. A method as claimed in claim 9, wherein the step of providing a first path and a second path further comprises the step of providing transmission lines comprising the first path and the second path.

11. A method as claimed in claim 10, wherein the step of providing a first path and a second path further comprises the step of providing chip capacitors to provide a DC block for the first and second MMIC single pole double throw switches.

12. A method as claimed in claim 10, wherein the step of providing transmission lines comprises the step of providing transmission lines having a length of one-fourth of a wavelength of the signal.

13. A method as claimed in claim 8, wherein the step of biasing first and second active variable reactance components comprises the step of biasing first and second pairs of varactor diodes.

14. A method as claimed in claim 13, wherein the step of applying a control voltage comprises the step of increasing a first voltage across the first pair of varactor diodes while simultaneously decreasing a second voltage across the second pair of varactor diodes to produce the phase difference between the signal traversing the first path relative to the signal traversing the second path.

15. An adjustable biphase modulator for phase modulating a signal, the biphase modulator comprising:

a first circuit path for the signal and a second circuit path for the signal, wherein the first circuit path includes a first active variable reactance component and the second circuit path includes a second active variable reactance component;

a bias voltage coupled to the first circuit path and to the second circuit path; and a control voltage coupled to the first and to the second active variable reactance components such that a first capacitance across the first active variable reactance component and a second capacitance across the second active variable reactance component are altered, resulting in a phase difference between the signal traversing the first circuit path relative to the signal traversing the second circuit path.

16. A biphase modulator as claimed in claim 15, further comprising first and second microwave monolithic integrated circuit (MMIC) single pole double throw switches coupled to the first circuit path and to the second circuit path for routing the signal to the first circuit path and to the second circuit path.

17. A biphase modulator as claimed in claim 16, wherein the first circuit path and the second circuit path comprise transmission lines having a length of one-fourth of a wavelength of the signal.

18. A biphase modulator as claimed in claim 17, wherein the first circuit path and the second circuit path further comprise chip capacitors to provide a DC block for the first and second MMIC single pole double throw switches.

19. A biphase modulator as claimed in claim 15, wherein the first and second active variable reactance components comprise first and second pairs of varactor diodes.

20. A biphase modulator as claimed in claim 19, wherein the control voltage increases a first voltage across the first pair of varactor diodes while simultaneously decreasing a second voltage across the second pair of varactor diodes to produce the phase difference between the signal traversing the first circuit path relative to the signal traversing the second circuit path.

* * * * *